US011009525B1

(12) United States Patent
Mody et al.

(10) Patent No.: US 11,009,525 B1
(45) Date of Patent: May 18, 2021

(54) SYSTEM AND METHOD FOR MEASURING ELECTRICAL PROPERTIES OF MATERIALS

(71) Applicant: GLOBALFOUNDRIES U.S. Inc., Santa Clara, CA (US)

(72) Inventors: Jay Mody, Ballston Lake, NY (US); Hemant Dixit, Halfmoon, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 15/931,792

(22) Filed: May 14, 2020

(51) Int. Cl.
*G01R 1/067* (2006.01)
*G01R 31/28* (2006.01)
*G01N 27/22* (2006.01)
*G01B 11/28* (2006.01)

(52) U.S. Cl.
CPC ........ *G01R 1/06783* (2013.01); *G01B 11/285* (2013.01); *G01N 27/221* (2013.01); *G01R 31/2831* (2013.01)

(58) Field of Classification Search
CPC ............ G01R 1/06783; G01R 31/2831; G01B 11/285; G01N 27/221
See application file for complete search history.

(56) References Cited

U.S. PATENT DOCUMENTS

| 5,036,271 | A | 7/1991 | Mazur et al. |
| 6,900,652 | B2 | 5/2005 | Mazur |
| 9,431,307 | B2 | 8/2016 | Okano |
| 10,073,126 | B2 | 9/2018 | Kume et al. |
| 2004/0251923 | A1* | 12/2004 | Mazur ................. G01R 1/0735 324/754.16 |
| 2014/0017826 | A1* | 1/2014 | Okano .................... H01L 22/10 438/18 |

FOREIGN PATENT DOCUMENTS

| JP | 2007311564 A | 11/2007 |
| JP | 2015099833 A | 5/2015 |

OTHER PUBLICATIONS

English Translation of JP 2015-099833A (Year: 2015).*

* cited by examiner

*Primary Examiner* — Paresh Patel
(74) *Attorney, Agent, or Firm* — Anthony Canale; Hoffman Warnick LLC

(57) ABSTRACT

An illustrative system disclosed herein includes a conductive probe that is adapted to hold a quantity of mercury, wherein the conductive probe includes a conductive body with an outlet and a mercury control system adapted to supply mercury to the conductive probe. In this example, the system also includes an image sensor that is adapted to obtain an image of a mercury droplet positioned on a surface of a material and a measurement system that is adapted to receive the image of the mercury droplet and calculate a contact area between the mercury droplet and the surface of the material based upon the image of the mercury droplet.

17 Claims, 6 Drawing Sheets

SYSTEM AND METHOD FOR MEASURING ELECTRICAL PROPERTIES OF MATERIALS

BACKGROUND

Field of the Disclosure

Generally, the present disclosure relates to various novel embodiments of a system and method for measuring electrical properties of materials.

Description of the Related Art

When manufacturing integrated circuit products on a semiconductor substrate, it is very important to determine various electrical characteristics of various layers of material and/or the substrate. One technique for performing such electrical testing involves using a measurement system that includes a vacuum operated mercury probe to form a conductive contact with the material being measured. Manufacturers of IC products typically purchase these types of measurement systems from third-party vendors.

To measure at least some of the electrical properties of a layer of material, e.g., capacitance, it is very important to accurately measure the contact area between a mercury droplet (that is dispensed from the mercury probe) and the surface of the layer of material. This type of system relies on the calibration of the contact area for accuracy, and such calibration is typically done by the third-party vendor. Such calibration activities involve some cost and can result in delays in manufacturing of IC products.

The present disclosure is directed to various novel embodiments of a system and method for measuring electrical properties of materials.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various novel embodiments of a system and method for measuring electrical properties of materials. An illustrative system disclosed herein includes a conductive probe that is adapted to hold a quantity of mercury, wherein the conductive probe comprises a conductive body with an outlet and a mercury control system adapted to supply mercury to the conductive probe. In this example, the system also includes an image sensor that is adapted to obtain an image of a mercury droplet positioned on a surface of a material and a measurement system that is adapted to receive the image of the mercury droplet and calculate a contact area between the mercury droplet and the surface of the material based upon the image of the mercury droplet.

An illustrative method disclosed herein includes positioning a conductive probe above a surface of a material, wherein the conductive probe comprises a conductive body with an outlet and a quantity of mercury positioned in the conductive body forcing a portion of the mercury within the conductive probe out of the outlet so as to form a mercury droplet on the surface of the material. In this example, the method also includes obtaining an image of the mercury droplet that is positioned on the surface of the material and calculating a contact area between the mercury droplet and the surface of the material based upon the image of the mercury droplet.

BRIEF DESCRIPTION OF THE DRAWINGS

The disclosure may be understood by reference to the following description taken in conjunction with the accompanying drawings, in which like reference numerals identify like elements, and in which.

Figure 1:
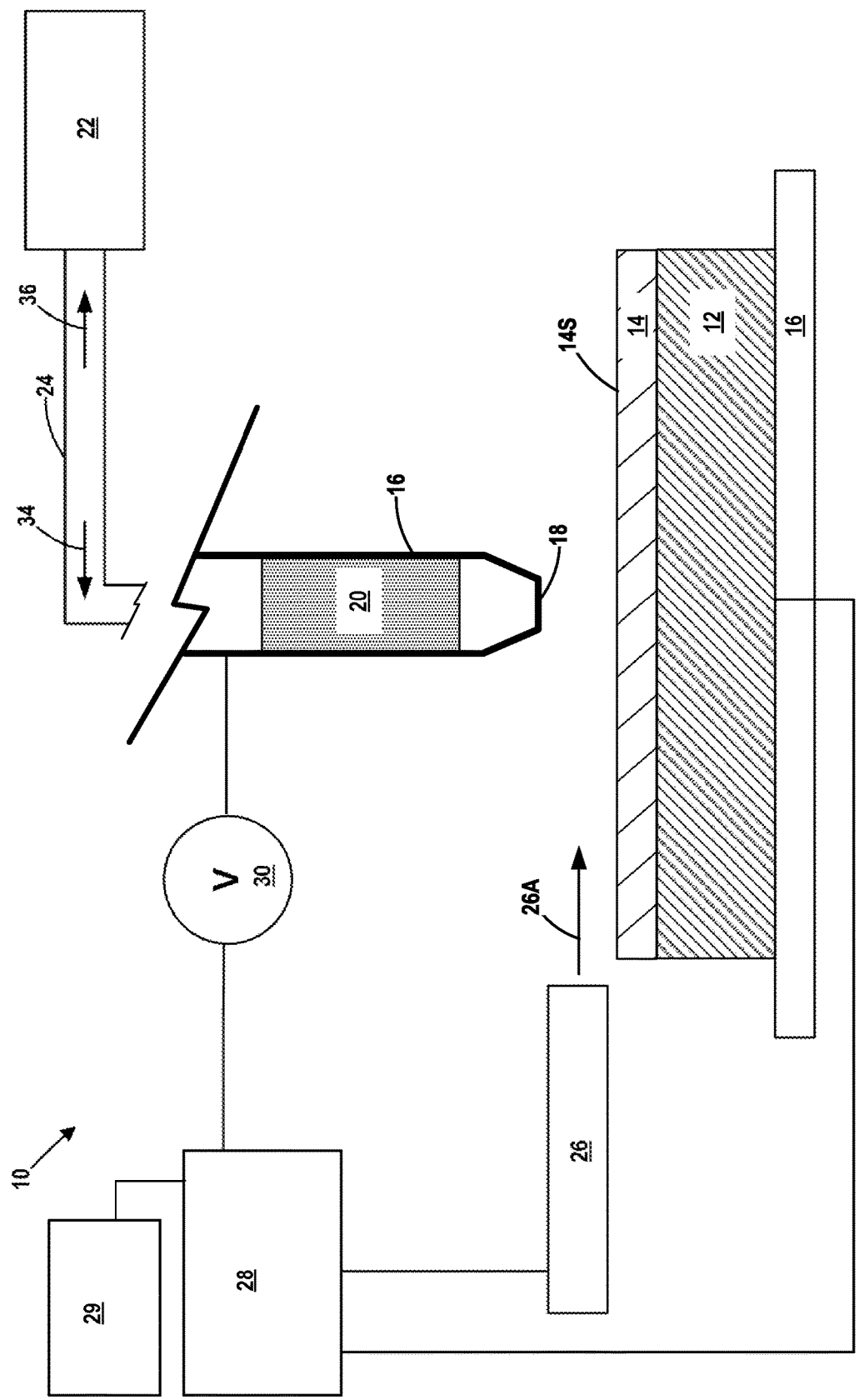
FIGS. 1-6 depict various novel embodiments of a system and method for measuring electrical properties of materials. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-6 depict various novel embodiments of a system 10 and method for measuring electrical properties of materials. In the example depicted herein, the system 10 will be used to measure one or more electrical properties of a layer of material 14 (with an upper surface 14S) that is formed on a semiconductor substrate 12. The substrate 12 is positioned in a holder 16, e.g., a wafer chuck, and secured therein by any of a variety of known mechanical means.

The substrate 12 may have a variety of configurations, such as a bulk semiconductor substrate depicted herein, or it may take the form of a semiconductor-on-insulator (SOI) substrate. Such an SOI substrate includes a base semiconductor layer, a buried insulation layer positioned on the base semiconductor layer and an active semiconductor layer positioned above the buried insulation layer. In some applications, the substrate 12 may be made of silicon or it may be made of semiconductor materials other than silicon. Thus, the terms "substrate" or "semiconductor substrate" should be understood to cover all semiconductor materials and all forms of such materials. Additionally, the substrate 12 may be of any physical size. In one example, the substrate may be a 300 mm wafer. In other cases, the substrate 12 may only be a portion of such a wafer.

The system 10 also includes a conductive probe 16 with an outlet 18. A representative column of mercury 20 is positioned within the conductive probe 16. The conductive probe 16 is comprised of a conductive material, e.g., stainless steel, titanium, a metal-containing material, a conductive polymer, etc. The system 10 also includes a simplistically depicted mercury control system 22, the components of which are known to those skilled in the art. The mercury control system 22 is operatively coupled to a line 24 that is, in turn, in fluid communication with the conductive probe 16. As will be described more fully below, the mercury control system 22 is adapted to apply a positive pneumatic pressure (as reflected by the arrowed line 34) behind the column of mercury 20 to force some of the mercury out of the outlet 18 of the conductive probe 16 and onto the surface 14S of the layer of material 14. After testing of the electrical properties of the layer of material 14 is completed, the mercury control system 22 is also adapted to apply a negative pneumatic pressure (as reflected by the arrowed line 36) behind the column of mercury 20 to remove the mercury from the surface 14S of the layer of material 14, i.e., to pull the mercury back into the conductive probe 16.

Also depicted in FIG. 1, is a simplistically depicted measurement system 28, an image sensor 26 and an AC/DC voltage source 30. The voltage source 30 is electrically coupled to the conductive probe 16. In the depicted example, the measurement system 28 includes circuitry that allows it to control the voltage applied to the conductive probe 16 via the voltage source 30. In other embodiments, the system 10 may contain a separate voltage controller. As described more fully below, the image sensor 26 is adapted to take an image of the mercury droplet (not shown in FIG. 1) that will be positioned on the surface 14S of the layer of material 14 and send that image to the measurement system 28 where, as described more fully below, calculations will be made to determine the contact area between the mercury droplet and the surface 14S of the layer of material 14. The measurement system 28 is coupled to a conductive contact (not shown) on the bottom surface of the substrate 12. Among other things, the measurement unit 28 is adapted to measure at least the inductance (L), capacitance (C) and resistance (R) of the material 14. In one example, the circuitry and structures to permit such measurements may be positioned internally within the measurement unit 28. However, in other embodiments, such as the one shown in FIG. 1, a separate LCR unit (or meter) 29 may be operatively coupled to the measurement unit 28, but that may not be the case in all situations.

As will be appreciated by those skilled in the art after a complete reading of the present application, the layer of material 14 may be comprised of virtually any material, e.g., any insulating material, e.g., silicon dioxide, silicon nitride, a high-k material (a material with a k value of 10 or greater), such as hafnium oxide, a low-k material (a material with a k value of 3.3 or less), dielectric films, a metal silicide, polymer films, metal-containing materials, etc. Moreover, the layer of material 14 depicted herein is representative in nature in that the layer of material 14 may actually comprise a plurality of layers of insulating material, e.g., a stack of material layers, and all of the materials layers within the stack of materials may each be made of a different material, but that may not be the case in all applications. Thus, use of the terminology "the layer of material 14" herein should not be understood to mean that the subject matter disclosed herein is limited to applications that involve measuring the electrical properties of a single layer of material. Additionally, the layer or layers of material 14 depicted herein may be formed by any known technique. For example, in the case where the layer of material 14 is silicon dioxide, it may be formed by performing a thermal growth process or by performing a deposition process. The layer(s) of material 14 may be formed to any desired thickness.

FIG. 1 depicts the system 10 prior to any measurements taken of the layer of material 14. In the position shown in FIG. 1, the mercury control system 22 has applied a negative pressure (as reflected by the arrowed line 36) behind the column of mercury 20 to retain the column of mercury 20 within the conductive probe 16.

Figure 2:
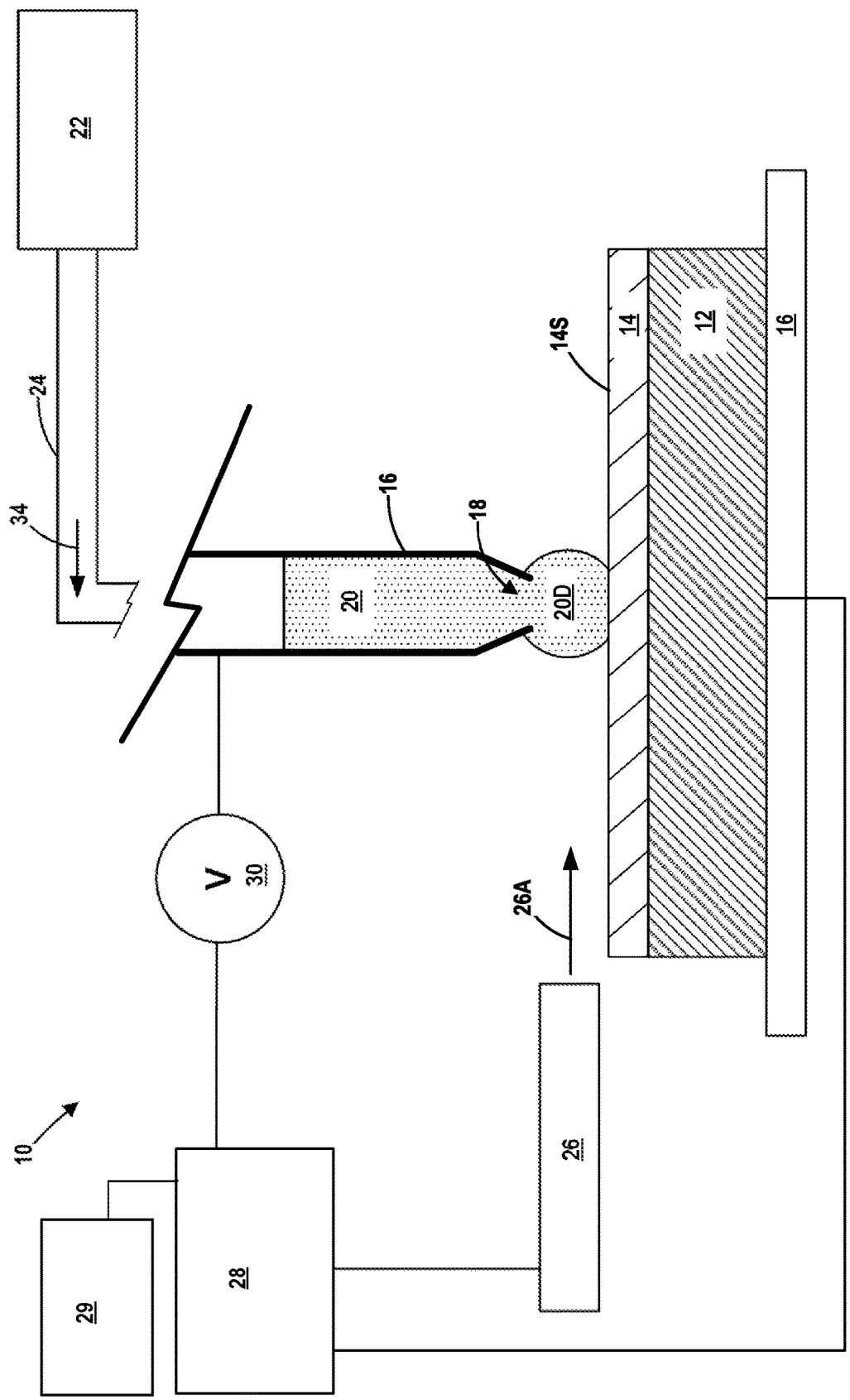
Figure 3:
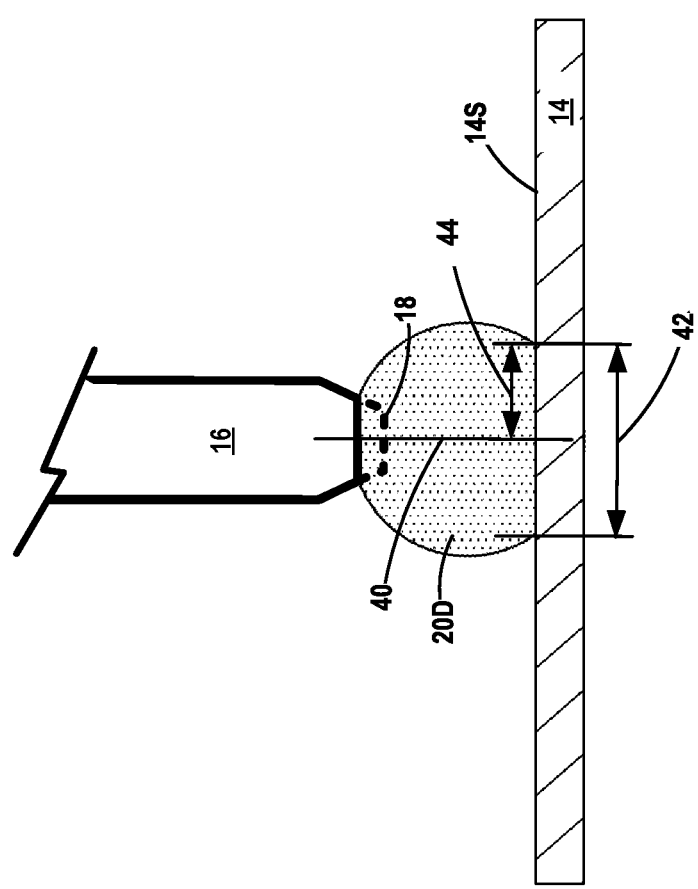

FIG. 2 depicts the system 10 after the mercury control system 22 applied a positive pressure (as reflected by the arrowed line 34) behind the column of mercury 20 to force some of the mercury out of the outlet 18 of the conductive probe 16 and form a mercury droplet 20D on the surface 14S of the layer of material 14. Note that, in one illustrative embodiment, the conductive probe 16 remains in conductive contact with the mercury droplet 20D throughout the electrical testing described herein. FIG. 3 is an enlarged view of portions of the system 10 with the mercury droplet 20D positioned on the surface 14S of the layer of material 14. In the depicted example, the image sensor 26 is positioned such that the imaging axis 26A of the lens of the image sensor 26 is directed substantially horizontally, so as to allow the image sensor 26 to capture a true side view of the mercury droplet 20D. However, in other embodiments, the image sensor 26 may be positioned at an angle relative to the horizontal. In such a situation, adjustments may be made to the formulas used to calculate the contact area to account for the oblique image of the mercury droplet 20D taken by the image sensor 26 that is positioned in such a manner.

FIG. 3 depicts the image of the mercury droplet 20D and a portion of the conductive probe 16 that is taken by the image sensor 26 and transmitted to the measurement system 28. To measure at least some of the electrical properties of the layer of material 14, it is very important to accurately measure the contact area 42 between the mercury droplet 20D and the surface 14S of the layer of material 14. The measurement system 28 contains software that permits it to determine the radius 44 of the mercury droplet 20D (relative to a vertical line 40 running through the center of the mercury droplet 20D) at the interface between the mercury droplet 20D and the surface 14S of the layer of material 14. With the radius 44 now known, calculation of the contact area 42 is straightforward ($A=\pi r^2$).

Note that this is a substantially real-time measurement of the contact area 42. Also note that, by controlling the voltage applied to the conductive probe 16, the physical size of the mercury droplet 20D, and thus the size of its contact area 42, can be controlled. This is a real-time capability of the system 10, and such real-time capability may be important for several reasons. First, based upon the substantially real-time image of the mercury droplet 20D, the system permits a user of the system to control the contact area 42 of the mercury droplet 20D by controlling the voltage applied to the conductive probe 16. Thus, in one example, all of the measurements of the properties of several materials may be made using approximately the same contact area 42, thereby perhaps leading to more uniform testing results. If the initial image of the mercury droplet 20D reveals that the contact area 42 is less than or greater than a target value for the contact area 42, the voltage applied to the conductive probe 16 may be adjusted to effectuate the desired change in size of the contact area 42.

Additionally, based upon the substantially real-time image of the mercury droplet 20D, the physical size of the mercury droplet 20D may be controlled by changing the physical distance between the outlet 18 of the conductive probe 16 and the upper surface 14S of the layer of material. If the initial image of the mercury droplet 20D reveals that the contact area 42 is less than or greater than a target value for the contact area 42, the distance between the outlet 18 of the conductive probe 16 and the upper surface 14S of the layer of material may be adjusted to effectuate the desired change in size of the contact area 42. The desired spacing between the outlet 18 and the upper surface 14S may be achieved by physically moving one or both of the substrate 12 or the conductive probe 16 using various mechanical systems and means (not shown) known to those skilled in the art. In one embodiment, the measurement unit 28 may control the mechanical systems and means for moving one or both of the substrate 12 and/or the conductive probe 16. In other embodiments, the measurement unit 28 may simply send one or more commands to a separate controller (not shown) that controls such mechanical systems to effectuate the desired movement of the substrate 12 and/or conductive probe 16.

In some embodiments, the size of the contact area 42 may be adjusted by controlling the voltage applied to the conductive probe 16 and by changing the physical distance between the outlet 18 of the conductive probe 16 and the upper surface 14S of the layer of material 14. Moreover, using the systems and methods disclosed herein will avoid having to periodically have an outside vendor calibrate the contact area of prior art measurement systems.

After determining the contact area 42, the measurement system 28 applies a desired voltage to the conductive probe 16 via the voltage source 30 and then determines any of a variety of different electrical characteristics of the layer of material 14, e.g., capacitance, dielectric constant, breakdown voltage, barrier height, current leakage, Time Dependent Dielectric Breakdown (TDDB), doping concentration, interface charge density, surface charge density, etc.

Figure 4:
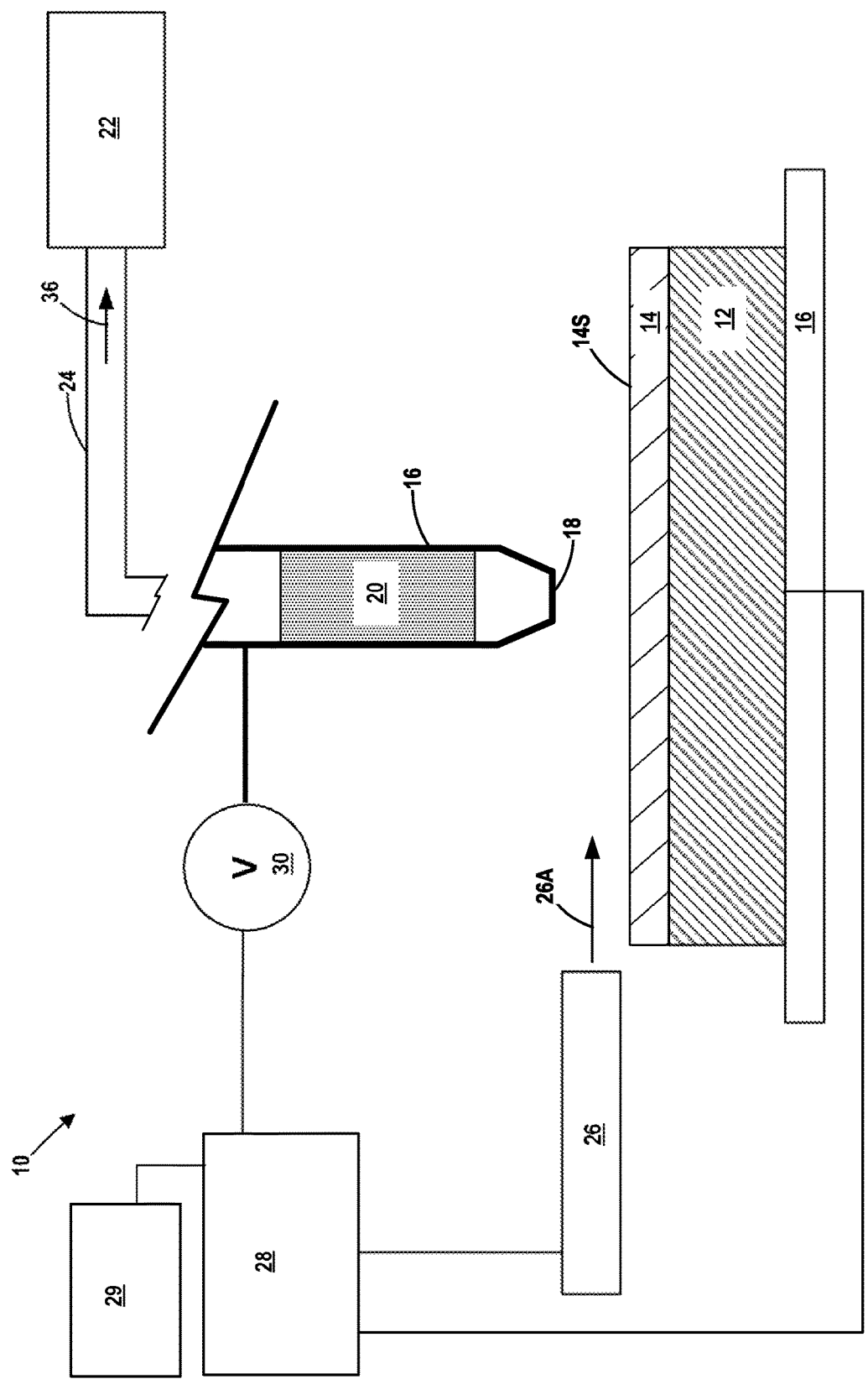

As shown in FIG. 4, after all measurements have been taken, the mercury control system 22 applied a negative pressure (as reflected by the arrowed line 36) behind the column of mercury 20 to remove the mercury droplet 20D from the surface 14S of the layer of material 14, i.e., to pull all of the mercury back into the conductive probe 16.

Figure 5:
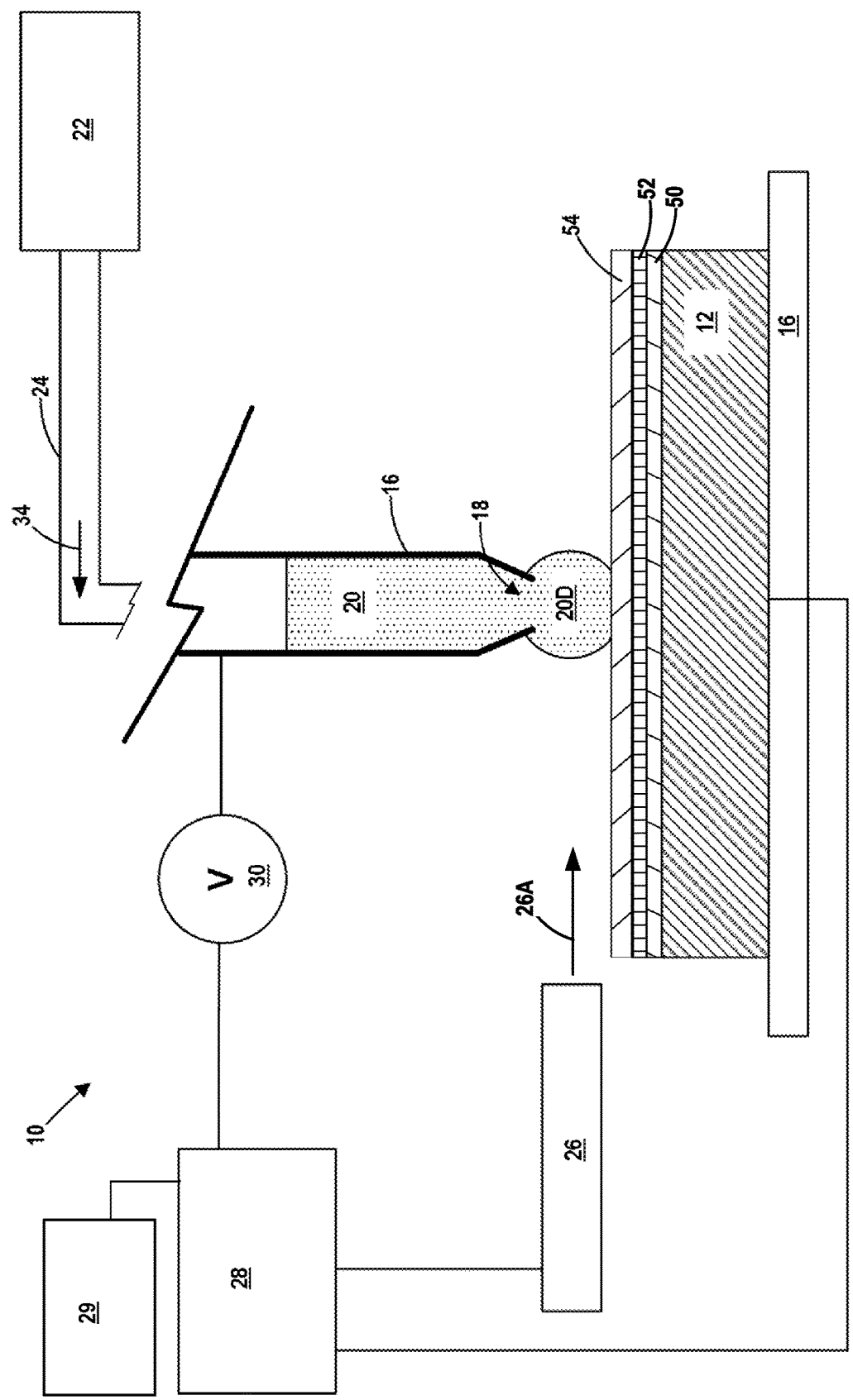
Figure 6:
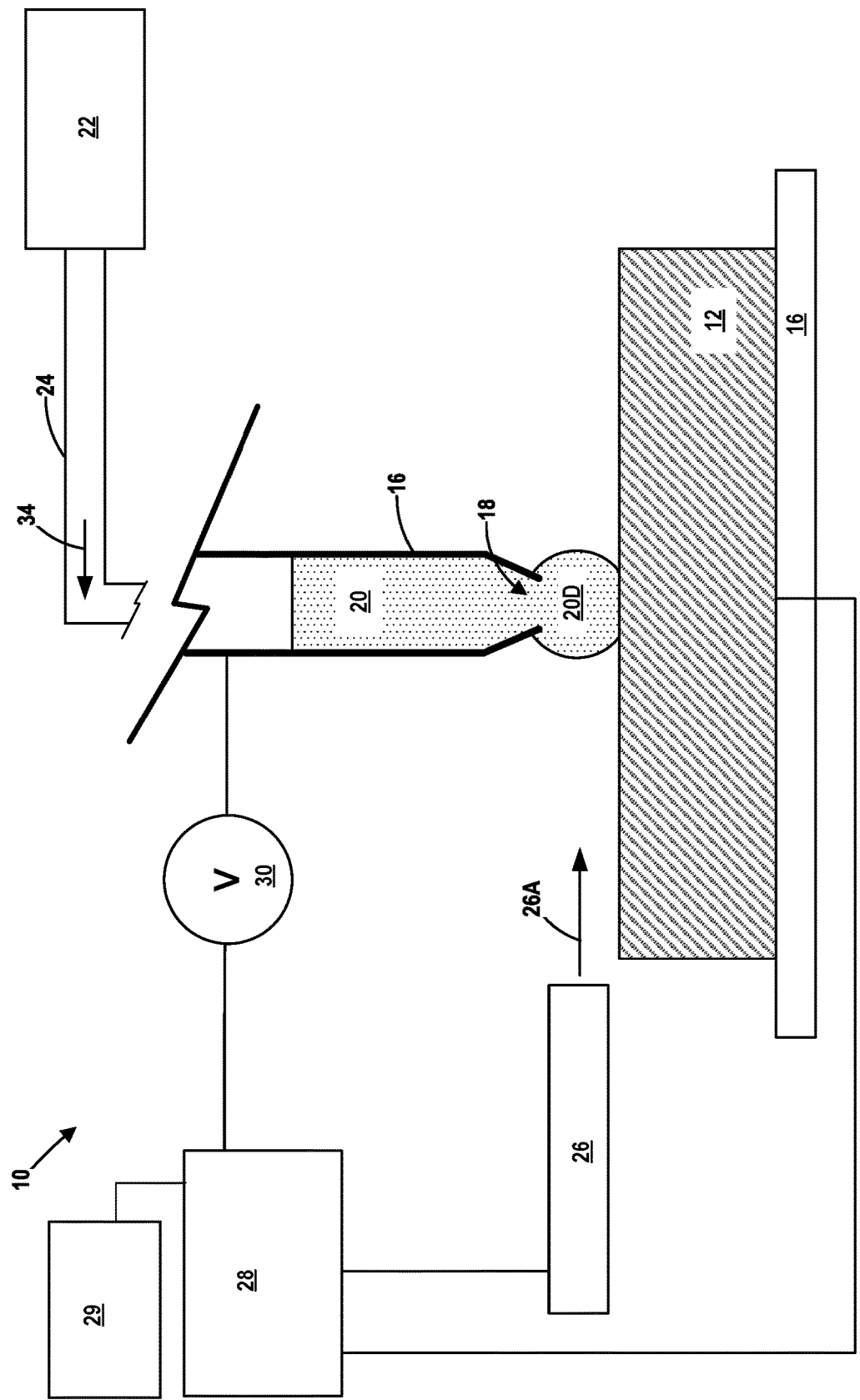

As noted above, the system 10 disclosed herein may be used to obtain real-time measurements of the electrical properties of a stack of materials. FIG. 5 depicts an example, where the stack comprises three layers of material 50, 52 and 54. FIG. 6 depicts an example wherein the system 10 may be used to determine the electrical characteristics of the substrate 12.

Portions of the invention and corresponding detailed description are presented in terms of software, or algorithms and symbolic representations of operations on data bits within a computer memory of one or more of the measurement system 28, the mercury control system 22 and/or the image sensor 26 or perhaps a stand-alone computer. These descriptions and representations are the ones by which those of ordinary skill in the art effectively convey the substance of their work to others of ordinary skill in the art. An algorithm, as the term is used herein, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Unless specifically stated otherwise, or as is apparent from the discussion, terms such as "processing" or "computing" or "calculating" or "determining" or "displaying" or the like refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A system, comprising:
   a conductive probe that is adapted to hold a quantity of mercury, the conductive probe comprising a conductive body with an outlet;
   a mercury control system adapted to supply mercury to the conductive probe;
   an image sensor that is adapted to obtain an image of a mercury droplet positioned on a surface of a material, wherein the image sensor includes a lens with an imaging axis that is oriented substantially parallel to the surface of the material; and
   a measurement system that is adapted to receive the image of the mercury droplet and calculate a contact area between the mercury droplet and the surface of the material based upon the image of the mercury droplet.

2. The system of claim 1, wherein the material comprises at least one layer of material positioned above a semiconductor substrate and wherein the surface is an upper surface of the at least one layer of material.

3. The system of claim 1, wherein the material comprises a semiconductor substrate and wherein the surface is an upper surface of the semiconductor substrate.

4. The system of claim 1, wherein the material comprises one of silicon dioxide, silicon nitride, a high-k material, a dielectric film, a metal silicide, a polymer film, a metal-containing material or a semiconductor material.

5. The system of claim 1, wherein the measurement system is further adapted to calculate at least one of a capacitance, a dielectric constant, a breakdown voltage, a barrier height, a current leakage, Time Dependent Dielectric Breakdown (TDDB), a doping concentration, an interface charge density or a surface charge density of the material using at least the calculated contact area.

6. The system of claim 1, further comprising a voltage source that is conductively coupled to the conductive probe.

7. The system of claim 1, further comprising an LCR (inductance (L), capacitance (C) and resistance (R)) unit that is operatively coupled to the measurement unit.

8. A system, comprising:
   a semiconductor substrate;
   at least one layer of material positioned above an upper surface of the semiconductor substrate;
   a conductive probe that is adapted to hold a quantity of mercury, the conductive probe comprising a conductive body with an outlet
   a mercury control system adapted to supply mercury to the conductive probe and force a portion of the mercury within the conductive probe out of the outlet so as to form a mercury droplet positioned on an upper surface of the at least one layer of material;
   an image sensor that is adapted to obtain an image of the mercury droplet positioned, wherein the image sensor comprises a lens with an imaging axis that is oriented substantially parallel to the surface of the material; and
   a measurement system that is adapted to receive the image of the mercury droplet and calculate a contact area between the mercury droplet and the upper surface of the at least one layer of material based upon the image of the mercury droplet.

9. The system of claim 8, further comprising a voltage source that is conductively coupled to the conductive probe.

10. The system of claim 8, further comprising an LCR unit that is operatively coupled to the measurement unit.

11. A method, comprising:
    positioning a conductive probe above a surface of a material, the conductive probe comprising a quantity of mercury positioned therein and wherein the conductive probe comprises a conductive body with an outlet;
    forcing a portion of the mercury within the conductive probe out of the outlet so as to form a mercury droplet on the surface of the material;
    obtaining an image of the mercury droplet that is positioned on the surface of the material, wherein obtaining the image of the mercury droplet comprises positioning an image sensor such that an imaging axis of a lens of the image sensor is oriented substantially parallel to the surface of the material; and
    calculating a contact area between the mercury droplet and the surface of the material based upon the image of the mercury droplet.

12. The method of claim 11, wherein the material comprises at least one layer of material positioned above a semiconductor substrate and wherein the surface is an upper surface of the at least one layer of material or wherein the material comprises a semiconductor substrate and wherein the surface is an upper surface of the semiconductor substrate.

13. The method of claim 11, wherein obtaining the image of the mercury droplet comprises obtaining a substantially real-time image of the mercury droplet so as to provide a feedback mechanism to adjust or maintain a size of the contact area.

14. The method of claim 11, further comprising calculating at least one of a capacitance, a dielectric constant, a breakdown voltage, a barrier height, a current leakage, Time Dependent Dielectric Breakdown (TDDB), a doping concentration, an interface charge density or a surface charge density of the material using at least the calculated contact area.

15. The method of claim 11, further comprising, based upon the image of the mercury droplet, applying a voltage to the conductive probe.

16. The method of claim 11, further comprising, based upon the image of the mercury droplet, applying a voltage to the conductive probe to change the contact area between the mercury droplet and the surface of the material.

17. The method of claim 11, further comprising, based upon the image of the mercury droplet, changing a vertical spacing between an outlet of the conductive probe and the surface of the material to change the contact area between the mercury droplet and the surface of the material.

* * * * *